United States Patent
Federspiel (10) Patent No.: US 6,396,934 B1
(45) Date of Patent: May 28, 2002

(54) ANALOG AUDIO FILTER FOR HIGH FREQUENCIES

(75) Inventor: Lionel Federspiel, Grenoble (FR)

(73) Assignee: SGS–Thomson Microelectronics S.A., Gentilly (FR)

( * ) Notice: Subject to any disclaimer, the term of this patent is extended or adjusted under 35 U.S.C. 154(b) by 0 days.

(21) Appl. No.: 08/865,394

(22) Filed: May 29, 1997

(30) Foreign Application Priority Data

May 31, 1996 (FR) .......................................... 96 06947

(51) Int. Cl.⁷ .............................. H03G 5/00; H03F 1/36
(52) U.S. Cl. ........................... 381/100; 381/98; 330/97; 330/282; 333/28 T
(58) Field of Search ................................ 330/282, 284; 333/28 T, 28 R; 381/98, 101, 102, 103

(56) References Cited

U.S. PATENT DOCUMENTS

| | | | |
|---|---|---|---|
| 3,769,606 A | | 10/1973 | Henegar |
| 4,224,581 A | * | 9/1980 | Watanabe et al. ............. 333/14 |
| 4,509,021 A | * | 4/1985 | Van Uden ................... 330/282 |
| 4,633,189 A | * | 12/1986 | Kawakami et al. ........ 333/28 T |
| 4,994,770 A | * | 2/1991 | Niwayama .................. 381/98 |
| 5,245,229 A | * | 9/1993 | Colvin, Sr. ................. 330/282 |
| 5,327,101 A | * | 7/1994 | Neely et al. ................ 330/284 |
| 5,523,721 A | * | 6/1996 | Segawa et al. ............. 330/282 |
| 5,812,687 A | * | 9/1998 | Onetti et al. ................... 381/97 |

FOREIGN PATENT DOCUMENTS

EP    A-0 511 536    11/1992

OTHER PUBLICATIONS

Proccedings of the Custom Integrated Circuits Conference, San Diego, May 15–18, 1989, No. CONF. 11, May. 15, 1989, Institute of Electrical and Electronics Engineers, pp. 1611–1615, Roesgen J. P., et al. "An Analog Front End Chip For V.32 Modems".

* cited by examiner

Primary Examiner—Forester W. Isen
Assistant Examiner—Brian Pendleton
(74) Attorney, Agent, or Firm—Wolf, Greenfield & Sacks, P.C.; James H. Morris (57) ABSTRACT

The present invention relates to an active analog filter including a differential amplifier, an output of which provides a filtered signal and a non-inverting input of which is connected to a median potential between supply potentials of the amplifier, a first series association of a first fixed resistor and a first variable resistor between an input terminal of a signal to be filtered and an inverting input terminal of the amplifier, a second series association of a second fixed resistor and a second variable resistor between the output of the amplifier and its inverting input terminal, and a third variable resistor in series with a filtering capacitor, between a midpoint of one of the series associations and the median potential.

27 Claims, 4 Drawing Sheets

ANALOG AUDIO FILTER FOR HIGH FREQUENCIES

BACKGROUND OF THE INVENTION

1. Field of the Invention

The present invention relates to an analog audio filter for correcting high frequencies. The present invention more particularly applies to the implementation of an active filter to be integrated in an analog mixer, for example, of a sound card for a microcomputer.

2. Discussion of the Related Art

Figure 1:
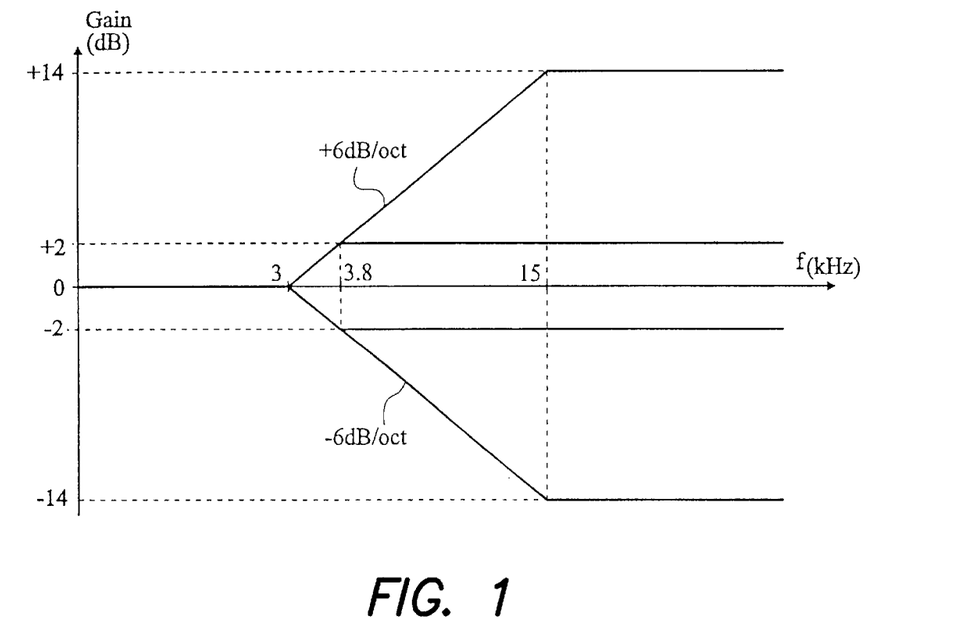
FIGS. 1 to 3, previously described, are meant to show the state of the art and the problem to solve.

An active filter for correcting high frequencies must respect a given attenuation contour. FIG. 1 shows, in the form of a gain/frequency characteristic, the attenuation contour of an analog audio filter for correcting high frequencies to which the present invention applies.

The transfer function of the filter has a fixed pole, generally at 3 kHz and 0 dB, and a pole which is a function of the gain of the amplifier. The frequency variation of the variable pole follows a slope of ±6 dB per octave from the fixed pole. In the example shown in FIG. 1, the linear gain is 0 dB for frequencies lower than 3 kHz. For a gain of ±2 dB, the cut-off frequency is 3.8 kHz. For a gain of ±14 dB, the cut-off frequency becomes 15 kHz.

With respect to the application of active filters to sound cards for microcomputers, the filter attenuation contour generally is symmetrical with respect to 0 dB. To implement such an active filter, for amplification or for attenuation, a programmable filter is generally used.

Figure 2:
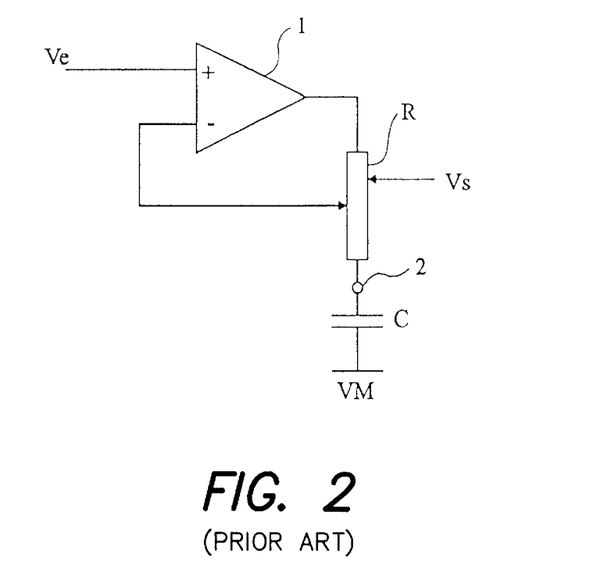

FIG. 2 shows a first example of a conventional assembly for implementing an active filter having an attenuation contour such as shown in FIG. 1.

This assembly uses a differential amplifier 1 mounted as a follower. An analog input signal Ve is sent to a non-inverting input of amplifier 1. An output of amplifier 1 is connected, via a resistor R in series with a filtering capacitor C, to a supply terminal corresponding to the median potential Vm, for example ground, between supply potentials of amplifier 1. Resistor R has two intermediary terminals for defining two variable resistors for setting, respectively, the cut-off frequency and the gain of the filter. A first intermediary terminal is connected to an inverting input of amplifier 1 and the value of the resistance, between the output of amplifier 1 and its inverting input, sets the cut-off frequency of the filter. A second intermediary terminal of resistor R is used to obtain an output signal Vs, the value of the resistance between the output terminal of amplifier 1 and this second intermediary terminal setting the gain of the filter.

Apart from capacitor C, the value of which (approximately several tens of nanofarads) is too high to enable its integration, all components of the filter generally are integrated within a same circuit, for example an analog mixer. Thus, the operation of a filter such as shown in FIG. 1 requires that the circuit to which it is integrated has a terminal 2 for connecting capacitor C.

A disadvantage of a follower assembly such as shown in FIG. 2 is that it has a high output impedance, since output voltage Vs is obtained via a resistive component. This generally requires the association of the assembly shown in FIG. 2 with an impedance adaptation follower stage.

In a follower assembly such as that shown in FIG. 2, the setting of the value of resistance R between the output terminal of amplifier 1 and the second intermediary terminal of resistor R allows the assembly to operate either as an amplifier or as an attenuator.

Figure 3:
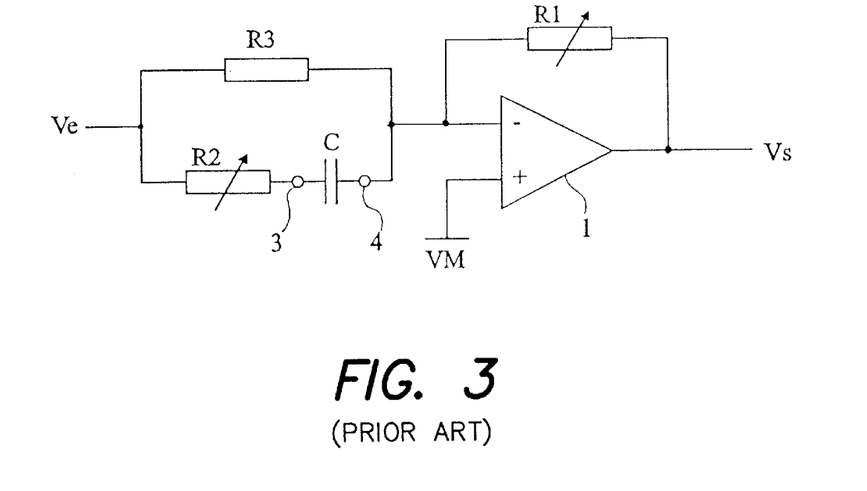

FIG. 3 shows a second example of a conventional assembly for an analog audio filter. Here, a differential amplifier 1 mounted as an inverter is used. A non-inverting input of amplifier 1 is connected to a potential Vm generally corresponding to the median potential of a supply voltage (not shown) of amplifier 1. An output of amplifier 1 provides filtered signal Vs and is connected, via a first variable resistor R1, to an inverting input of amplifier 1. The signal Ve to be filtered is sent, via a second variable resistor R2 in series with a capacitor C, to the inverting input of amplifier 1, a fixed resistor R3 being mounted in parallel to the series association of resistor R2 and capacitor C.

In a low frequency mode, that is, for frequencies which are lower than 3 kHz according to the attenuation contour of FIG. 1, the gain of the amplifier is set by the quotient of resistance R1 over resistance R3. Resistance R1 thus is adjusted to correspond to the value of resistance R3 so that the assembly has a unity gain. The high frequency gain of the inverting assembly shown in FIG. 3 corresponds to the quotient of resistance R1 over the parallel association of resistances R2 and R3. Resistance R2 is used to set the cut-off frequency of the filter.

While an inverting assembly such as shown in FIG. 3 overcomes the disadvantages of a follower assembly such as shown in FIG. 2, it has the disadvantage of requiring, in order to be integrated, two terminals, respectively 3 and 4, for connection to capacitor C.

The assembly shown in FIG. 3 corresponds to an amplifier assembly. To implement an attenuator assembly, the series association of resistor R2 and capacitor C is placed in parallel to resistor R1. Upon integration of the assembly, switches are generally used to obtain an amplifying filter or an attenuating filter from a same amplifier 1.

SUMMARY OF THE INVENTION

The present invention aims at overcoming the disadvantages of known assemblies, by providing an analog audio filter for correcting high frequencies, the integration of which only requires one connection terminal for a filtering capacitor, while avoiding the use of an additional follower amplifier for adapting the output impedance. The present invention also aims at providing a digitally-controlled active analog filter.

To achieve these objects, embodiments of the present invention provide an analog active filter that includes: a differential amplifier, an output of which issues a filtered signal and a non-inverting input of which is connected to a median potential between supply potentials of the amplifier, a first series association of a first fixed resistor and a first variable resistor between an input terminal of a signal to be filtered and an inverting input terminal of the amplifier, a second series association of a second fixed resistor and a second variable resistor between the output of the amplifier and its inverting input, and a third variable resistor in series with a filtering capacitor, between a midpoint of one of the series associations and the median potential.

According to an embodiment of the present invention, the resistors and the amplifier are implemented in the form of an integrated circuit, a first terminal of the third variable resistor being connected to a terminal for connecting an external capacitor to the integrated circuit, and a second terminal of the third variable resistor being connected to the midpoint of one of the series associations.

According to an embodiment of the present invention, the third variable resistor is connected to the midpoint of the first series association, to form an amplifying filter.

According to an embodiment of the present invention, the third variable resistor is connected to the midpoint of the second series association, to form an attenuating filter.

According to an embodiment of the present invention, the filter includes switching means for selecting the midpoint to which the third variable resistor is connected. According to a further embodiment of the present invention, the switching means are comprised of two CMOS switches.

According to an embodiment of the present invention, each of the variable resistors includes a plurality of fixed resistors mounted in series and associated with switches. According to a further embodiment of the present invention, the switches associated with the series mounted fixed resistors are N-channel MOS transistors. According to a still further embodiment of the present invention, the switches associated with the series mounted fixed resistors are controlled by digital signals, each variable resistor including a same number of switches and each digital signal simultaneously controlling one switch of each variable resistor.

According to an embodiment of the present invention, the filter is applied to correcting high frequencies of an analog audio signal.

The foregoing and other objects, characteristics and advantages of the present invention will be discussed in detail in the following non-limiting description of specific embodiments of the present invention, in relation with the accompanying drawings.

DETAILED DESCRIPTION

For clarity, the same components are referred to by the same references in the different drawings.

To begin with, basic assemblies of the present invention for the implementation of amplifying and attenuating filters will be described in relation with FIGS. 4 to 6. Then, an embodiment of an analog programmable filter which can operate both as an amplifier and as an attenuator will be discussed in relation with FIG. 7.

Figure 4:
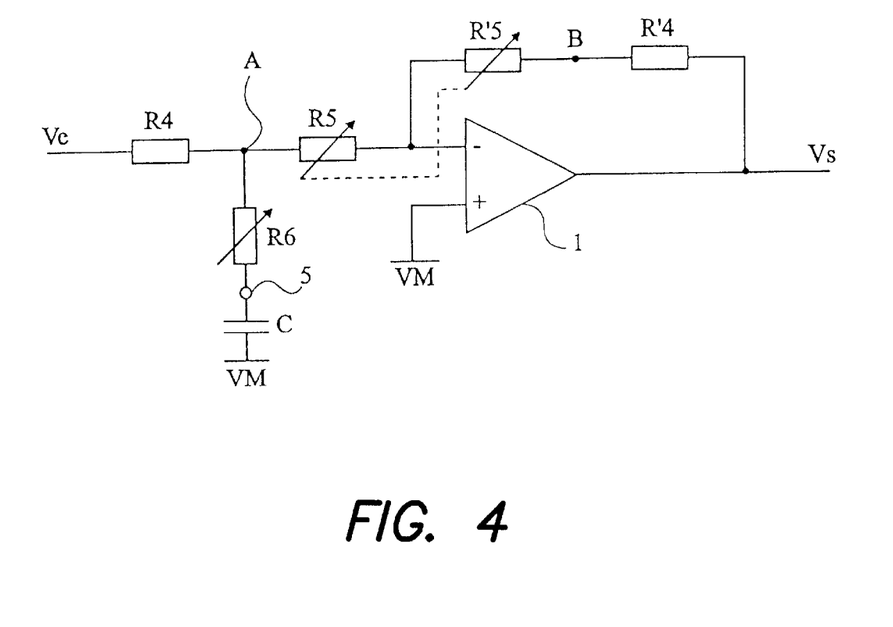
FIG. 4 shows an embodiment of a filter according to the present invention, mounted as an amplifier.

FIG. 4 schematically shows an embodiment of an analog audio filter mounted as an amplifier according to the present invention. The basic assembly of the filter according to the present invention includes a differential amplifier 1, a non-inverting input of which is brought to a potential Vm corresponding to the median potential of a supply voltage (not shown) of amplifier 1. An inverting input of amplifier 1 receives, via a first fixed resistor R4, mounted in series with a first variable resistor R5, an analog signal Ve to be filtered. The control loop of amplifier 1 includes a second variable resistor R'5 mounted in series with a second fixed resistor R'4 between the inverting terminal and an output terminal of amplifier 1 providing a filtered signal Vs. A filtering capacitor C is connected between potential Vm and the midpoint A of the series association of resistors R4 and R5 via a third variable resistor R6.

Resistances R4 and R'4 have the same value and resistances R5 and R'5 are adjusted to a same value. Thus, the linear gain of the low-frequency assembly is a unity gain.

Figure 5:
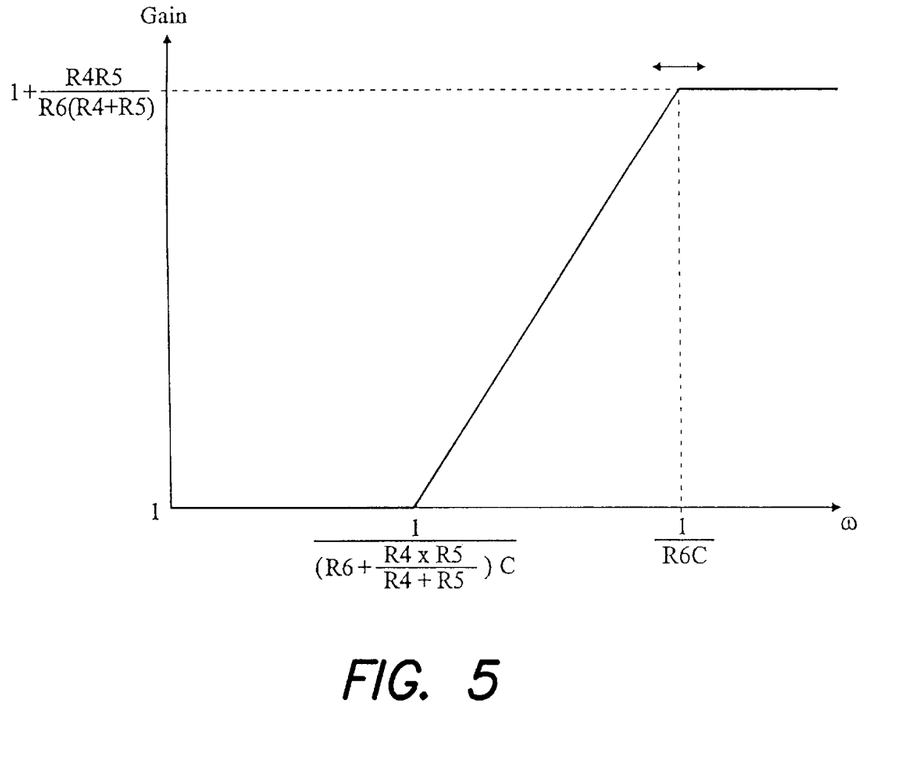
FIG. 5 shows the gain-pulse characteristics of a filter such as that shown in FIG. 4.

FIG. 5 shows the gain-pulse characteristic of an assembly such as that shown in FIG. 4. For clarity, notations R4 and R5 will be used hereafter to indicate the values taken by, respectively, resistances R4 and R'4 and resistances R5 and R'5.

A first cut-off pulse (corresponding to the fixed pole of FIG. 1) is given by:

$$1/[(R6+R4*R5/(R4+R5))*C].$$

A second cut-off pulse of the filter according to the present invention is given by $1/(R6*C)$. This second cut-off pulse corresponds to the variable pole of the attenuation contour of FIG. 1.

The linear gain of the filter is a unity gain for pulses lower than the first cut-off pulse. The gain of the filter is equal to $1+R4*R5/[R6*(R4+R5)]$ for frequencies equal to or higher than the second cut-off pulse.

Since the values of resistance R6 and of capacitor C intervene in the two poles of the filter, the fact that resistances R5 and R'5 are variable is used to compensate for the variations of resistance R6 in order to maintain a fixed pole in the transfer function of the filter.

As it can be seen in FIG. 4, a single terminal 5 is now sufficient to connect capacitor C to an integrated circuit containing amplifier 1 as well as the different resistors. Moreover, the output impedance of the assembly is low, since the filtered signal is directly taken from the output of differential amplifier 1.

Figure 6:
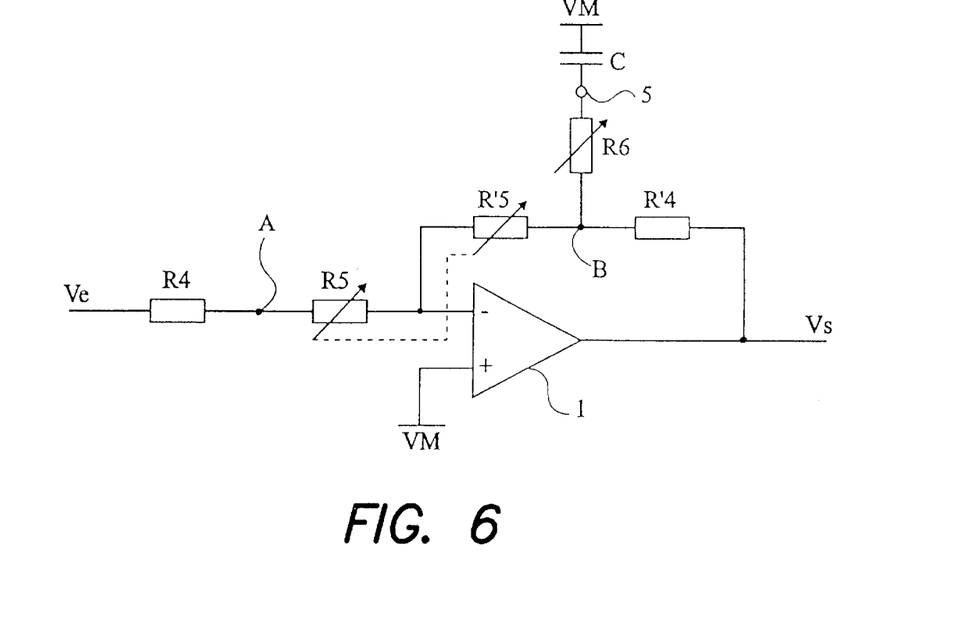
FIG. 6 shows an embodiment of a filter according to the present invention, mounted as an attenuator.

FIG. 6 schematically shows a filter, according to the present invention, which is mounted as an attenuator. According to the present invention, the only difference between the amplifier assembly and the attenuator assembly is that the series association of resistor R6 and of capacitor C is no longer connected to point A, but to the midpoint B of the series association of resistors R'5 and R'4 in the control loop of amplifier 1.

The gain-pulse characteristic of such an attenuating filter is similar to that shown in FIG. 5, but is inverted with respect to the pulse axis.

An advantage of the present invention is that, in order to turn an amplifier assembly into an attenuator assembly, or conversely, it is enough to move one terminal of resistor R6 from point A to point B, or conversely. This advantage will be better appreciated from the following description, made in relation with FIG. 7 which illustrates an embodiment of an analog programmable filter according to the present invention.

Figure 7:
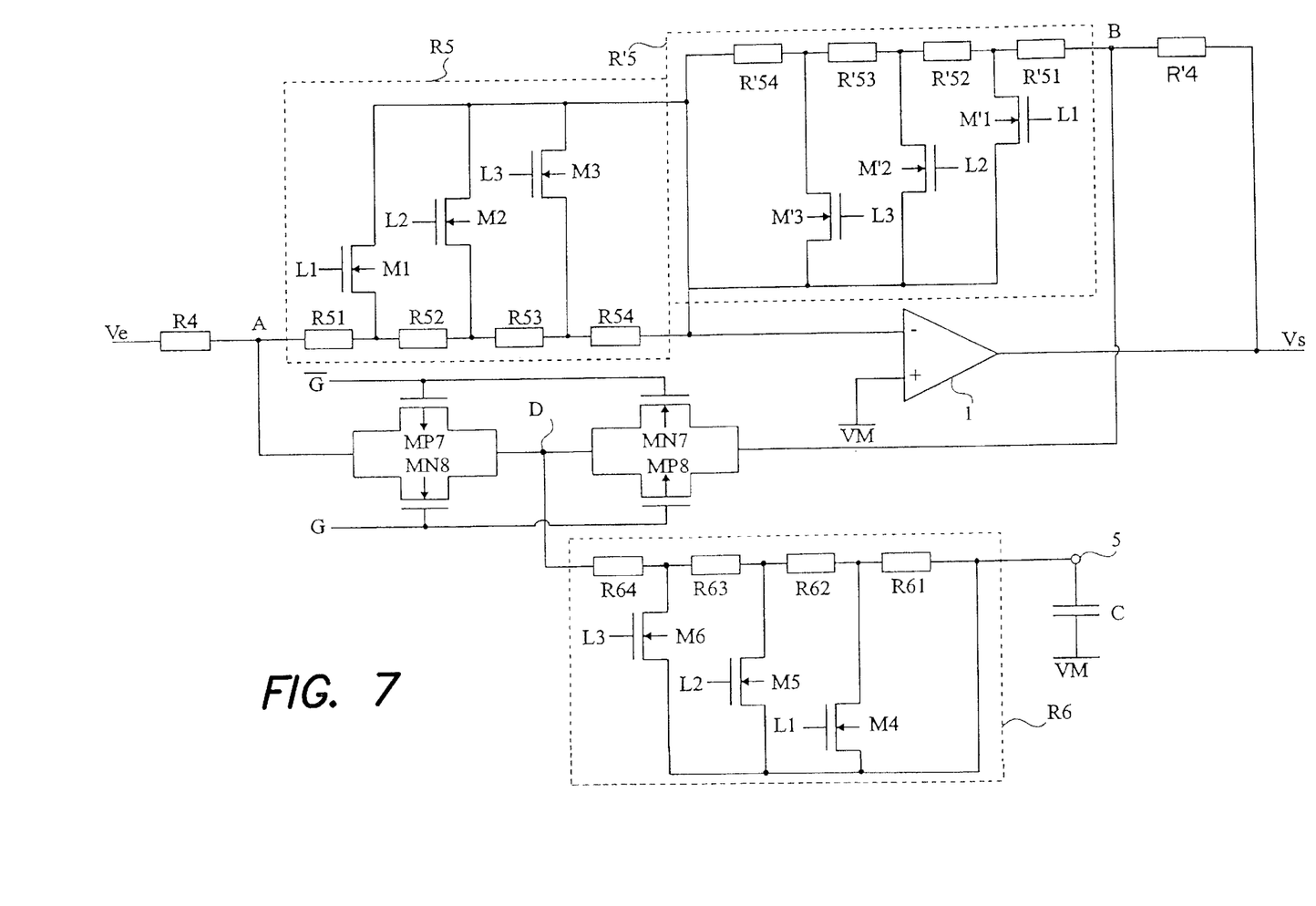
FIG. 7 shows an embodiment of an analog programmable filter according to the present invention.

According to the present invention, two CMOS switches are used to connect resistor R6 either to point A or to point B. A first switch is comprised of two MOS transistors in series, respectively P-channel transistor MP7 and N-channel transistor MN7, connected between points A and B. A second switch is comprised of two MOS transistors in series, respectively N-channel transistor MN8 and P-channel transistor MP8, connected between points A and B. A first terminal of resistor R6 is connected to external terminal 5 for connecting capacitor C. A second terminal of resistor R6 is connected to the midpoint D of the two CMOS switches mounted in parallel, defined by the common drains of transistors MP7, MN7, MN8, and MP8.

The switching of the connection of resistor R6 is performed, for example, by means of digital signals G and NOT G sent to the respective gates of the transistors of the CMOS switches. Transistors MN8 and MP8 receive a signal G. Transistors MP7 and MN7 receive a signal NOT G which is the inverse of signal G. When signal NOT G is in the high state (signal G being in the low state), transistors MP7 and MN8 conduct and transistors MN7 and MP8 are blocked. Resistor R6 is connected to point A and the assembly operates as an amplifying filter. When signal G is in the low state (signal NOT G being in the high state), transistors MN7 and MP8 are conducting and transistors MP7 and MN8 are blocked. Resistor R6 is connected to point B and the assembly operates as an attenuating filter.

An advantage of the present invention is that, by using CMOS switches for connecting resistor R6, the harmonic distortions generated by the resistance of the MOS transistor in the conducting state are minimized. Indeed, the drain-source resistance of the transistors forming the switches are in series with resistor R6. By using CMOS switches, the influence of the series resistance of the transistors is minimized since these series resistances are always in parallel with each other when in association with resistor 6.

Variable resistors R5, R'5, and R6 each are implemented by means of a network of fixed resistors associated with switches, preferably, N-channel MOS transistors. Thus, in the example shown in FIG. 7, resistor R5 includes a series association of four fixed resistors R51, R52, R53, and R54, resistors R52 to R54 being able to be short-circuited by means of N-channel MOS transistors M1, M2, and M3. A first terminal of variable resistor R5 forms a first terminal of resistor R51 and a second terminal of variable resistor R5 forms a second terminal of resistor R54. A second terminal of resistor R51 is connected to a first terminal of resistor R52 and, via a transistor M1, to the second terminal of resistor R54. A second terminal of resistor R52 is connected to a first terminal of resistor R53 and, via a transistor M2, to the second terminal of resistor R54. A second terminal of resistor R53 is connected to a first terminal of resistor R54 and, via a transistor M3, to the second terminal of resistor R54.

Resistors R'5 and R6 include similar assemblies. Variable resistor R'5 includes a series association of fixed resistors R'51, R'52, R'53 and R'54, and three N-channel MOS transistors, respectively M'1, M'2, and M'3. Variable resistor R6 includes a series association of fixed resistors R61, R62, R63 and R64, and three N-channel MOS transistors, respectively M4, M5, and M6.

To implement the switches of variable resistors R5, R'5, and R6, N-channel MOS transistors are preferably used, since the voltage across such transistors varies only slightly, and they thus generate few harmonic distortions. Indeed, according to an embodiment of the present invention, resistances R4 and R'4 are significantly higher than resistances R5, R'5, and R6. For example, resistances R4 and R'4 are around one hundred kΩ and resistances R5, R'5, and R6 are around ten kΩ. Thus, the voltage drop in the variable resistors is approximately 10% of the voltage drop in resistors R4 and R'4.

The control of the MOS transistors included in variable resistors R5, R'5, and R6 also is performed by means of digital signals.

According to the present invention, and in order to compensate for the variations in the value of resistance R6 by variations in the respective values of resistances R5 and R'5 to maintain the fixed pole of the attenuation contour of FIG. 1, each resistor R5, R'5, and R6 receives the same control signals. Transistors M1, M'1, and M4 are controlled by a first signal L1. Transistors M2, M'2, and M5 are controlled by a second signal L2. Transistors M3, M'3, and M6 are controlled by a third signal L3.

As a specific example, and assuming that the resistors are properly sized, when the three signals L1, L2, and L3 simultaneously are in a low state, all the NMOS transistors forming variable resistors R5, R'5, and R6 are blocked and the amplification or the attenuation performed by the assembly is at its maximum. When signal L1 is in a high state, signals L2 and L3 being in a low state, resistance R6 corresponds to the sum of resistances R62, R63, and R64, while resistances R5 and R'5 correspond, respectively, to resistances R51 and R'51. The gain of the assembly then is, for example, ±2 dB according to the state of signal G. When signal L2 is in a high state, signals L1 and L3 being in a low state, resistance R6 corresponds to the sum of resistances R63 and R64, while resistances R5 and R'5 correspond, respectively, to the sums of resistances R51, R52 and R'51, R'52. The gain of the assembly then is, for example, ±4 dB according to the state of signal G. When signal L3 is in a high state, signals L1 and L2 being in a low state, resistance R6 corresponds to resistance R64, while resistances R5 and R'5 correspond to the respective sums of resistances R51 to R53 and R'51 to R'53. The gain of the assembly then is, for example, ±6 dB according to the state of signal G.

The setting pitch of resistors R5, R'5, and R6 depends on the number of switches and of fixed resistors used for their implementation. It should however be noted that, according to the present invention, resistors R5, R'5, and R6 all include the same number of fixed resistors and switches.

Of course, the present invention is likely to have various alterations, modifications, and improvements which will readily occur to those skilled in the art. In particular, the sizing of the different components forming the filter according to the present invention is within the abilities of those skilled in the art according to the functional indications given hereabove.

Moreover, although reference has been made in the foregoing description to a filter having a symmetrical attenuation contour with respect to 0 dB, it should be noted that the filter can have an asymmetrical attenuation contour. For this purpose, it is sufficient to alter the generation of control signals L1, L2, and L3 according to whether the filter is to operate as an amplifier or as an attenuator.

Further, although reference has been made in the foregoing description to an analog audio filter, the present invention more generally applies to any type of analog programmable filter having an attenuation contour with one fixed pole having a unity gain and one variable pole moving along a determined slope having a linear gain.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. An active analog filter including a differential amplifier having an output which provides a filtered signal and a non-inverting input which is connected to a median potential between supply potentials of the amplifier, the filter comprising:

a first series association between an input terminal of the filter and an inverting input of the amplifier, the first series association including a first fixed resistor in series with a first variable resistor;

a second series association between the output of the amplifier and the inverting input of the amplifier, the second series association including a second fixed resistor in series with a second variable resistor and a resistance of the second variable resistor varying in a same direction with a resistance of the first variable resistor; and a third variable resistor that is adapted to be connected in series with a filtering capacitor between a midpoint of one of the series associations and the median potential.

2. The active analog filter of claim 1, wherein the resistors and the amplifier are implemented in an integrated circuit, a first terminal of the third variable resistor being connected to a terminal of the integrated circuit for externally connecting the filtering capacitor to the integrated circuit, and a second terminal of the third variable resistor being connected to the midpoint of one of the series associations.

3. A filter according to claim 1, wherein the third variable resistor is connected to the midpoint of the first series association, and wherein the filter forms an amplifying filter when connected in series with the filtering capacitor.

4. A filter according to claim 1, wherein the third variable resistor is connected to the midpoint of the second series association and the filter forms an attenuating filter when connected in series with the filtering capacitor.

5. A filter according to claim 1, further comprising switching means for externally selecting the midpoint of one of the series associations to which the third variable resistor is connected.

6. The active analog filter of claim 5, wherein the switching means includes two CMOS switches.

7. A filter according to claim 1, wherein each of the variable resistors includes a plurality of fixed resistors mounted in a series and associated with a plurality of switches.

8. A filter according to claim 7, wherein the plurality of switches included in each of the variable resistors are N-channel MOS transistors.

9. A filter according to claim 7, wherein the plurality of switches included in each of the variable resistors are controlled by digital signals, each variable resistor including a same number of switches and each digital signal simultaneously controlling one switch of each variable resistor.

10. A filter according to claim 1, wherein the filter corrects high frequencies of an analog audio signal.

11. A filter having a first input for receiving an input signal, a second input for electrically coupling the filter to a capacitor, and an output for providing a filtered output signal, the filter comprising:

a differential amplifier having an inverting input and an output, the output of the differential amplifier being electrically coupled to the output of the filter;

a first association of a first fixed resistor and a first variable resistor that is electrically coupled in series between the first input of the filter and the inverting input of the differential amplifier, the first fixed resistor being electrically coupled to the first variable resistor at a first midpoint;

a second association of a second fixed resistor and a second variable resistor that is electrically coupled in series between the inverting input of the differential amplifier and the output of the differential amplifier, the second fixed resistor being electrically coupled to the second variable resistor at a second midpoint and a resistance of the second variable resistor varying in a same direction with a resistance of the first variable resistor;

a third variable resistor electrically connected between the second input of the filter and only one of the first and second midpoints.

12. The filter of claim 11, wherein the filter is integrated in a single integrated circuit.

13. The filter of claim 11, wherein the third variable resistor is electrically coupled to the first midpoint, and wherein the filter is an amplifying filter.

14. The filter of claim 13, wherein the filter has a first fixed pole and a second variable pole, the filter having unity gain when a frequency of the input signal is less than the first fixed pole, a fixed gain when the frequency of the input signal is greater than the second variable pole, and a gain that varies linearly with the frequency of the input signal when the frequency of the input signal is greater than the first fixed pole and less than the second variable pole.

15. The filter of claim 11, wherein the third variable resistor is electrically coupled to the second midpoint, and wherein the filter is an attenuating filter.

16. The filter of claim 15, wherein the filter has a first fixed pole and a second variable pole, the filter having unity attenuation when a frequency of the input signal is less than the first fixed pole, a fixed attenuation when the frequency of the input signal is greater than the second variable pole, and an attenuation that varies linearly with the frequency of the input signal when the frequency of the input signal is greater than the first fixed pole and less than the second variable pole.

17. The filter of claim 11, further comprising:

a switch having a first terminal that is connected to the first midpoint, a second terminal that is connected to the second midpoint, and a third terminal that is connected to the third variable resistor, the switch electrically coupling the third variable resistor to one of the first and second midpoints in response to a control signal.

18. The filter of claim 11, wherein a resistance of the first fixed resistor is approximately equal to a resistance of the second fixed resistor, and wherein the resistance of the first variable resistor is approximately equal to the resistance of the second variable resistor.

19. A filter having a first input for receiving an input signal, a second input for electrically coupling the filter to a capacitor, and an output for providing a filtered output signal, the filter comprising:

a differential amplifier having an inverting input and an output, the output of the differential amplifier being electrically coupled to the output of the filter;

a first association of a first fixed resistor and a first variable resistor that is electrically coupled in series between the first input of the filter and the inverting input of the differential amplifier, the first fixed resistor being electrically coupled to the first variable resistor at a first midpoint;

a second association of a second fixed resistor and a second variable resistor that is electrically coupled in series between the inverting input of the differential amplifier and the output of the differential amplifier, the second fixed resistor being electrically coupled to the second variable resistor at a second midpoint;

a third variable resistor electrically coupled between the second input of the filter and one of the first and second midpoints; and a switch having a first terminal that is connected to the first midpoint, a second terminal that is connected to the second midpoint, and a third terminal that is connected to the third variable resistor, the switch electrically coupling the third variable resistor to one of the first and second midpoints in response to a control signal, wherein the switch includes:

first and second MOS transistors each having a drain, a source, and a gate, the drain of the first MOS transistor being electrically coupled to the drain of the second MOS transistor, the source of the first MOS transistor being electrically coupled to the first midpoint and the source of the second MOS transistor being electrically coupled to the second midpoint, and the gates of the first and second MOS transistors being electrically coupled to receive the control signal; and third and fourth MOS transistors each having a drain, a source, and a gate, the drain of the third MOS transistor being electrically coupled to the drain of the fourth MOS transistor and the drains of the first and second MOS transistors, the source of the third MOS transistor being electrically coupled to the first midpoint and the source of the fourth transistor being electrically coupled to the second midpoint, and the gates of the third and fourth MOS transistors being electrically coupled to receive an inverse of the control signal.

20. The filter of claim 19, wherein the first and fourth MOS transistors are N-channel CMOS transistors, and wherein the second and third MOS transistors are P-channel CMOS transistors.

21. A filter having a first input for receiving an input signal, a second input for electrically coupling the filter to a capacitor, a third input for receiving a first control signal, and an output for providing a filtered output signal, the filter comprising:

a differential amplifier having an inverting input and an output, the output of the differential amplifier being electrically coupled to the output of the filter;

first and second resistors electrically coupled in series between the first input of the filter and the inverting input of the differential amplifier, the first resistor being electrically coupled to the second resistor at a first midpoint;

third and fourth resistors electrically coupled in series between the inverting input of the differential amplifier and the output of the differential amplifier, the third resistor being electrically coupled to the fourth resistor at a second midpoint;

a fifth resistor having first and second terminals, the first terminal of the fifth resistor being electrically coupled to the second input of the filter; and switching means, for electrically connecting the second terminal of the fifth resistor to only one of the first and second midpoints;

wherein the second resistor and the fourth resistor each include variable resistors having a resistance that varies in a same direction.

22. The filter of claim 21, wherein the fifth resistor includes a variable resistor having a resistance, and wherein the resistance of the second, fourth and fifth resistors varies in response to a second control signal, the second control signal adjusting one of a gain and an attenuation provided by the filter dependent on a state of the first control signal.

23. A filter having a first input for receiving an input signal, a second input for electrically coupling the filter to a capacitor, a third input for receiving a first control signal, and an output for providing a filtered output signal, the filter comprising:

a differential amplifier having an inverting input and an output, the output of the differential amplifier being electrically coupled to the output of the filter;

first and second resistors electrically coupled in series between the first input of the filter and the inverting input of the differential amplifier, the first resistor being electrically coupled to the second resistor at a first midpoint;

third and fourth resistors electrically coupled in series between the inverting input of the differential amplifier and the output of the differential amplifier, the third resistor being electrically coupled to the fourth resistor at a second midpoint;

a fifth resistor having first and second terminals, the first terminal of the fifth resistor being electrically coupled to the second input of the filter; and switching means, electrically coupled to the first and second midpoints and the second terminal of the fifth resistor, for changing the filter from an amplifying filter to an attenuating filter in response to the control signal;

wherein the switching means includes:

first and second MOS transistors each having a drain, a source, and a gate, the drain of the first MOS transistor being electrically coupled to the drain of the second MOS transistor, the source of the first MOS transistor being electrically coupled to the first midpoint and the source of the second MOS transistor being electrically coupled to the second midpoint, and the gates of the first and second MOS transistors being electrically coupled to receive the first control signal; and third and fourth MOS transistors each having a drain, a source, and a gate, the drain of the third MOS transistor being electrically coupled to the drain of the fourth MOS transistor and the drains of the first and second MOS transistors, the source of the third MOS transistor being electrically coupled to the first midpoint and the source of the fourth transistor being electrically coupled to the second midpoint, and the gates of the third and fourth MOS transistors being electrically coupled to receive an inverse of the first control signal.

24. An active analog filter including a differential amplifier having an output which provides a filtered signal and a non-inverting input which is connected to a median potential between supply potentials of the amplifier, the filter comprising:

a first series association between an input terminal of the filter and an inverting input of the amplifier, the first series association including a first fixed resistor in series with a first variable resistor;

a second series association between the output of the amplifier and the inverting input of the amplifier, the second series association including a second fixed resistor in series with a second variable resistor; and a third variable resistor that is adapted to be connected in series with a filtering capacitor between a midpoint of one of the series associations and the median potential.

25. The filter of claim 24, wherein the filter has a transfer function, and wherein the first and second variable resistors are adjusted to maintain a fixed pole in the transfer function of the filter.

26. A filter having a first input for receiving an input signal, a second input for electrically coupling the filter to a capacitor, a third input for receiving a first control signal, and an output for providing a filtered output signal, the filter comprising:

a differential amplifier having an inverting input and an output, the output of the differential amplifier being electrically coupled to the output of the filter;

first and second resistors electrically coupled in series between the first input of the filter and the inverting input of the differential amplifier, the first resistor being electrically coupled to the second resistor at a first midpoint;

third and fourth resistors electrically coupled in series between the inverting input of the differential amplifier and the output of the differential amplifier, the third resistor being electrically coupled to the fourth resistor at a second midpoint;

a fifth resistor having first and second terminals, the first terminal of the fifth resistor being electrically coupled to the second input of the filter; and switching means, for electrically connecting the second terminal of the fifth resistor to either one of the first and second midpoints to provide the filtered output signal having either one of gain and attenuation, respectively.

27. The filter of claim 26, wherein the filter has a transfer function, and wherein the second and fourth resistors are variable resistors that are adjusted to maintain a fixed pole in the transfer function of the filter.

* * * * *